United States Patent
Miller (10) Patent No.: US 9,025,282 B1
(45) Date of Patent: May 5, 2015

(54) ELONGATED TRACE TETHERS FOR DISK DRIVE HEAD SUSPENSION FLEXURES

(75) Inventor: Mark A. Miller, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 68 days.

(21) Appl. No.: 13/365,443

(22) Filed: Feb. 3, 2012

Related U.S. Application Data (60) Provisional application No. 61/441,470, filed on Feb. 10, 2011.

(51) Int. Cl.
*G11B 5/48* (2006.01)
*G11B 21/16* (2006.01)

(52) U.S. Cl.
CPC ............... *G11B 5/486* (2013.01); *G11B 5/4853* (2013.01)

(58) Field of Classification Search
CPC ..... G11B 5/486; G11B 5/4826; G11B 5/4853
USPC ................................. 360/245.3–246
See application file for complete search history.

(56) References Cited

U.S. PATENT DOCUMENTS

| | | | | |
|---|---|---|---|---|
| 5,933,293 A | * | 8/1999 | Bennin | 360/245.9 |
| 5,959,807 A | * | 9/1999 | Jurgenson | 360/245.7 |
| 6,249,404 B1 | * | 6/2001 | Doundakov et al. | 360/245.4 |
| 6,266,212 B1 | | 7/2001 | Coon | |
| 6,515,832 B1 | | 2/2003 | Girard | |
| 6,714,385 B1 | * | 3/2004 | Even et al. | 360/246 |
| 7,349,184 B2 | * | 3/2008 | Erpelding | 360/245.8 |
| 7,352,535 B2 | * | 4/2008 | Arya et al. | 360/245.9 |
| 7,384,531 B1 | | 6/2008 | Peltoma et al. | |
| 7,469,464 B1 | * | 12/2008 | Bjorstrom et al. | 29/603.06 |
| 7,518,830 B1 | | 4/2009 | Panchal et al. | |
| 7,567,410 B1 | * | 7/2009 | Zhang et al. | 360/245.9 |
| 7,813,082 B2 | | 10/2010 | Rice et al. | |
| 7,826,177 B1 | * | 11/2010 | Zhang et al. | 360/245.3 |
| 7,898,772 B1 | * | 3/2011 | Ziaei et al. | 360/245.8 |
| 8,085,506 B1 | * | 12/2011 | Ee et al. | 360/245.8 |
| 8,208,224 B1 | * | 6/2012 | Teo et al. | 360/245.3 |
| 8,446,695 B1 | * | 5/2013 | Ee et al. | 360/245.3 |
| 2006/0044695 A1 | * | 3/2006 | Erpelding | 360/245.9 |
| 2006/0291102 A1 | * | 12/2006 | Honda | 360/245.7 |
| 2007/0263325 A1 | * | 11/2007 | Hanya et al. | 360/245.3 |
| 2008/0030900 A1 | * | 2/2008 | Zeng et al. | 360/234.5 |
| 2010/0226047 A1 | * | 9/2010 | Arai | 360/245.8 |

* cited by examiner

*Primary Examiner* — Adam B Dravininkas
(74) *Attorney, Agent, or Firm* — Faegre Baker Daniels LLP

(57) ABSTRACT

An integrated lead flexure for a disk drive head suspension formed from layers of material including a spring metal layer, a conductive material layer and an insulating material layer between the spring metal and conductive material layers. One embodiment includes a gimbal region having flying traces and one or more elongated tethers extending from the spring metal layer and along a distance of the flying traces that is less than the length of the flying traces. Another embodiment includes a load beam spring region traversing portion having unsupported traces and one or more elongated tethers extending from the spring metal layer and along a distance of the unsupported traces that is less than the length of the unsupported traces.

22 Claims, 13 Drawing Sheets

ELONGATED TRACE TETHERS FOR DISK DRIVE HEAD SUSPENSION FLEXURES

CROSS-REFERENCE TO RELATED APPLICATION

This application claims priority to Provisional Application No. 61/441,470, filed Feb. 10, 2011, which application is incorporated herein by reference in its entirety and for all purposes.

BACKGROUND

Disk drive head suspensions are well know and commercially available. Suspensions of these types typically include an integrated lead flexure that is welded or otherwise attached to a load beam, and are disclosed, for example, in the following U.S. patents.

| Inventor Name | Pat. No. |
| --- | --- |
| Jurgenson | 5,959,807 |
| Coon | 6,266,212 |
| Girard | 6,515,832 |
| Peltoma et al. | 7,384,531 |
| Bjorstrom et al. | 7,469,464 |
| Panchal et al. | 7,518,830 |
| Rice et al. | 7,813,082 |

The integrated lead flexures are formed from overlaying layers of material including a stainless steel or other spring metal base layer, a layer of copper alloy or other conductive material, and a layer of insulating dielectric material that separates the base and conductive material layers. These devices typically include a base region and a distal gimbal region. The gimbal region includes a pair of transversely spaced spring arms in the base layer that support a head slider mounting region. Traces or leads formed in the conductive material layer extend along the length of the flexure and terminate at the gimbal region. Portions of the traces, sometimes known as flying leads, extend off the spring arms at the gimbal region to reduce the mechanical stiffness of that portion of the gimbal.

There remains a continuing need for improved integrated lead flexures. In particular, there is a need for integrated lead flexures with enhanced resonance and other mechanical specifications.

SUMMARY

The invention is an improved integrated lead flexure of the type including a spring metal layer, a conductive material layer and an insulating layer between the spring metal and conductive material layers. The flexure comprises first and second spaced-apart regions in the spring metal layer and an unsupported trace portion in the conductive material layer extending between the first and second spaced-apart regions. The unsupported trace portion has a length and is not backed by the spring metal layer. An elongated trace tether in the spring metal layer is connected to one of the first and second spaced-apart regions and extends along a distance of the unsupported trace portion that is less than the length of the unsupported trace portion. An insulating material portion in the insulating layer is between the unsupported trace portion and the elongated trace tether. The unsupported trace portion and elongated trace tether are in a gimbal region of the flexure in one embodiment. In another embodiment the unsupported trace portion and elongated trace tether are in a spring region traversing section of the flexure.

DETAILED DESCRIPTION

Figure 1A:
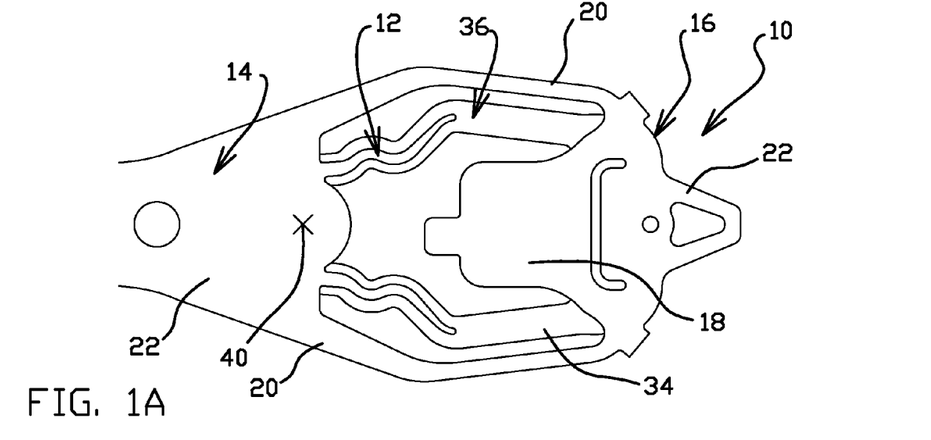
FIGS. 1A, 1B and 1C are bottom plan, top plan and bottom isometric views, respectively, of a portion of a flexure having elongated trace tethers in accordance with a first embodiment of the invention.
Figure 1B:
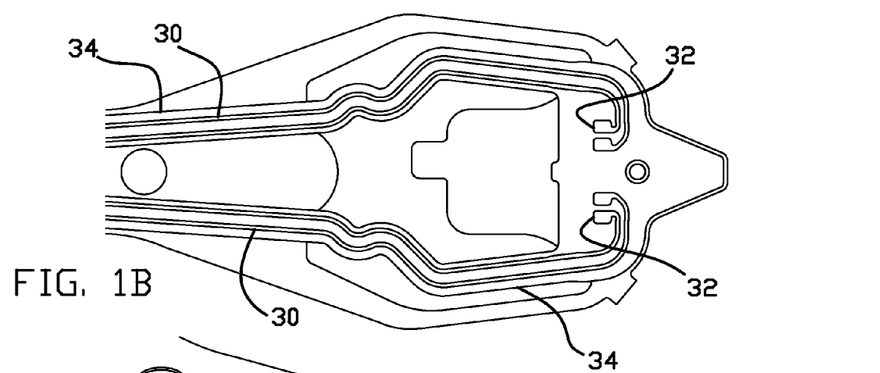
Figure 1C:
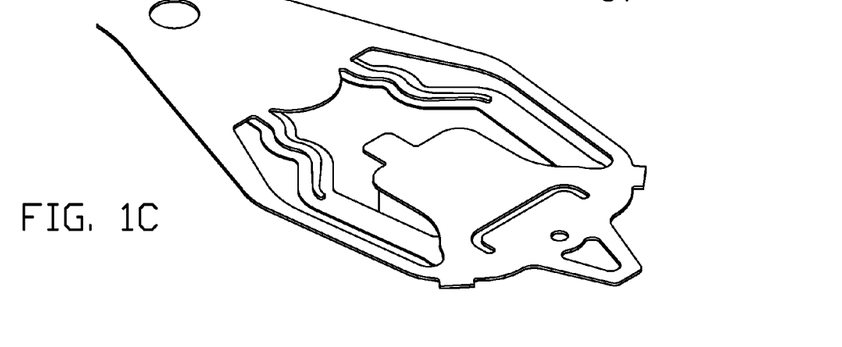

FIGS. 1A, 1B and 1C are bottom plan (i.e., stainless steel side), top plan (i.e., trace side) and bottom isometric views, respectively, of a portion of a flexure 10 having elongated trace tethers 12 in accordance with one embodiment of the invention. As shown, flexure 10 includes a base region 14 and a distal gimbal region 16. The gimbal region 16 includes a slider mounting region 18 and a pair of transversely spaced spring arms 20 that support the slider mounting region from the base region 14. Base region 14, slider mounting region 18 and spring arms 20 are formed in a spring metal layer 22. Traces 30 extend along the flexure 14 and terminate at bond pads 32 on the slider mounting region 18. The illustrated embodiment of gimbal region 16 has flying lead or trace portions 36 that are portions of the traces that extend off of the spring metal layer 22 and are unsupported by the spring metal layer (i.e., the flying traces are not backed by the material of the spring metal layer). In the embodiment shown in FIGS. 1A, 1B and 1C, for example, the flying trace portions 36 extend generally parallel to the spring arms 20 between the distal end of the base region 14 and the location where the spring arms meet the slider mounting region 18, and are located between the spring arms and the slider mounting region. Traces 30 are electrically insulated by dielectric layer 34 from the portions of the spring metal layer 22 that the traces 30 overlay. In the illustrated embodiment, dielectric layer 34 also overlays the flying trace portions 36. Although the illustrated embodiment of the invention has two traces 30 on each transverse side of the flexure 10, other embodiments (not shown) have other trace configurations including fewer or more traces and/or differing numbers of traces on each side of the flexure. The base region 14 of the flexure 10 is typically attached to a load beam (not shown) by welds such as 40.

Tethers 12 are relatively narrow and elongated portions of the spring metal layer 22 that extend along the flying trace portions 36 and are connected to other structures in the spring metal layer. In the embodiment shown in FIGS. 1A and 1C, for example, tethers 12 extend from the spring metal layer 22 at the proximal end of the gimbal region 16 (i.e., from base region 14, near weld 40), onto and along the flying trace portions 36. The tethers 12 preferably extend for a distance that is less than the length of the flying trace portions 36. In the embodiment illustrated in FIGS. 1A and 1C, for example, the tethers 12 extend about 50% of the proximal-most length of the flying trace portions 36 and are about 60 μm wide. In other embodiments the tethers 12 extend a distance of about 25%-50% of the length of the flying trace portions 36. In yet other embodiments the length of the tethers 12 extends for a distance up to about 70% of the length of the flying trace portions 36. In some embodiments of the invention this is a distance up to about 0.5 mm. The width of the tethers 12 is less than the length. In one embodiment the tethers 12 are about 40-60 μm wide. In other embodiments the tethers 12 can have a width as narrow as 20 μm or as wide as 100 μm. As described below, the length and width of the tethers 12 can be selected to optimize the resonance and other mechanical characteristics and specifications of the flexure 10. Although the tethers 12 are shown extending generally along the centerline of the flying trace portions 36 in the embodiment shown in FIGS. 1A and 1C, the tethers are positioned at other locations with respect to the centerline in other embodiments (not shown).

Tethers 12 will generally be relatively narrow to minimize the contribution of the structures to the pitch and roll stiffness of the gimbal region 16. It is optimal for the tethers 12 to extend a distance that provides support for the flying trace portions 36 and to urge the flying trace portions into the plane of the spring metal layer 22 at the pitch axis location. The tethers 12 provide additional rigidity and strength to the flying trace portions 36, thereby enhancing handling and ultrasonic robustness and improving pitch static attitude stability. By forcing the flying trace portions 36 to deform in such a manner that the neutral plane of the flying trace portions is close to the neutral plane of the spring arms 20, the pitch stiffness of the gimbal region 16 can be reduced. The natural frequency of the bending mode of the flying trace portions 36 can be increased and moved away from other suspension bending modes. This increased mode separation can improve resonance stability. Flexures 10 having tethers 12 can be manufactured using conventional or otherwise know additive and/or subtractive deposition, etching and photolithography processes.

Figure 2A:
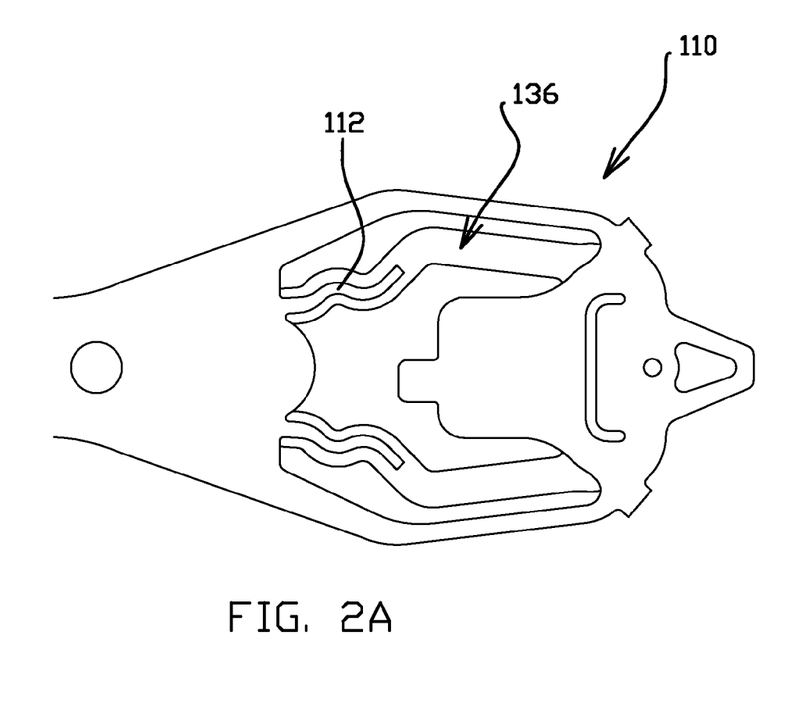
FIGS. 2A and 2B are bottom plan and isometric views, respectively, of a portion of a flexure having elongated trace tethers in accordance with a second embodiment of the invention.
Figure 2B:
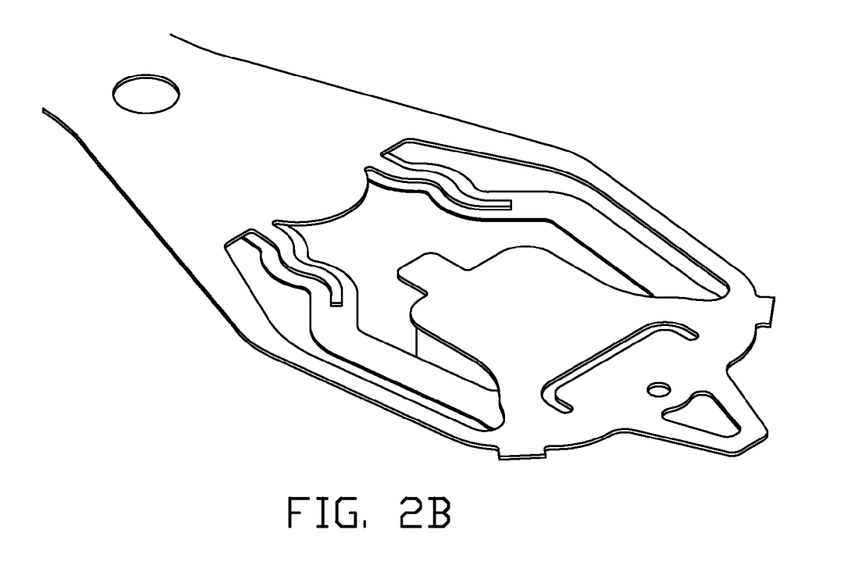

FIGS. 2A and 2B are bottom (i.e., stainless steel side) plan and isometric views of a portion of a flexure 110 having elongated trace tethers 112 in accordance with a second embodiment of the invention. Tethers 112 are shorter than the tethers 12 of the embodiment described above in connection with FIGS. 1A-1C, and extend for a distance of about 38% of the length of the flying trace portions 136. The tethers 112 can be about 60 μm wide, and are shown extending down the centerline of the flying trace portions 136 in FIGS. 2A and 2B. Other than these differences, flexure 110 and tethers 112 can be similar to or substantially the same as those described above in connection with FIGS. 1A-1C, and similar features are identified by similar reference numbers.

Figure 3A:
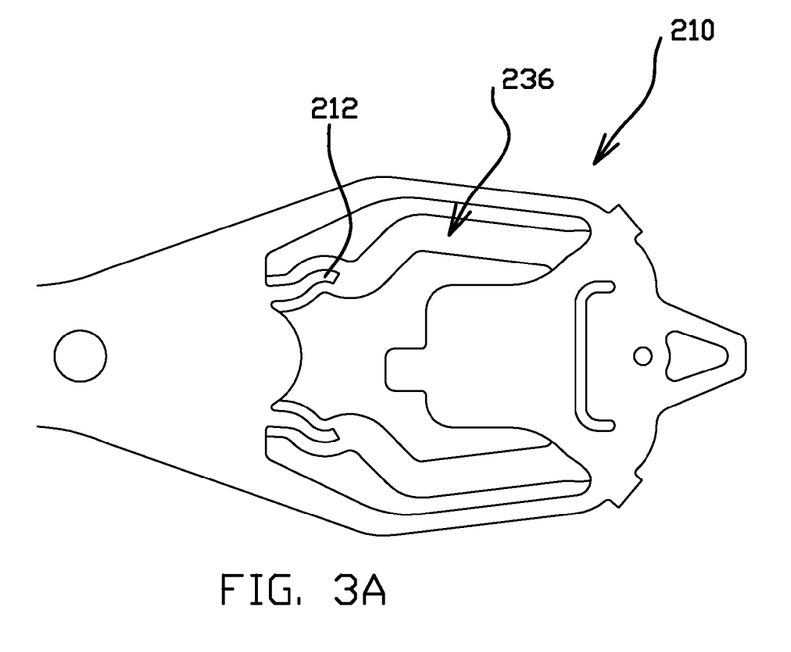
FIGS. 3A and 3B are bottom plan and isometric views, respectively, of a portion of a flexure having elongated trace tethers in accordance with a third embodiment of the invention.
Figure 3B:
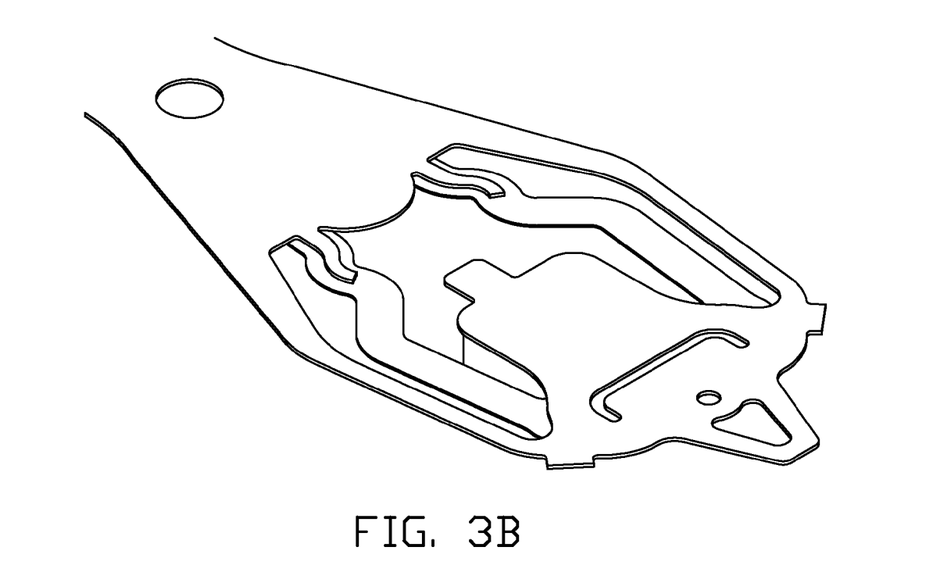

FIGS. 3A and 3B are bottom (i.e., stainless steel side) plan and isometric views of a portion of a flexure 210 having elongated trace tethers 212 in accordance with a third embodiment of the invention. Tethers 212 are shorter than the tethers 112 of the embodiment described above in connection with FIGS. 2A and 2B, and extend for a distance of about 25% of the length of the flying trace portions 236. The tethers 212 can be about 60 μm wide, and are shown extending down the centerline of the flying trace portions 236 in FIGS. 3A and 3B. Other than these differences, flexure 210 and tethers 212 can be similar to or substantially the same as those described above in connection with FIGS. 1A-1C, and similar features are identified by similar reference numbers.

Figure 4:
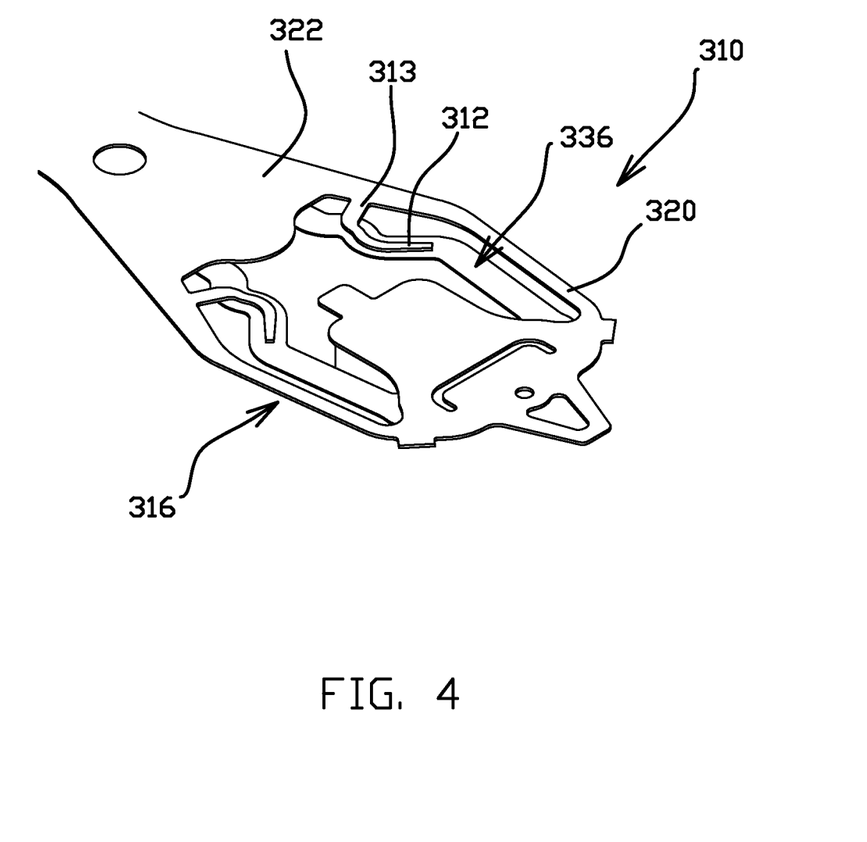
FIG. 4 is a bottom isometric view of a portion of a flexure having elongated trace tethers in accordance with a fourth embodiment of the invention.

FIG. 4 is a bottom (i.e., stainless steel side) isometric view of a portion of a flexure 310 having elongated trace tethers 312 in accordance with a fourth embodiment of the invention. Tethers 312 extend onto the flying trace portions 336 from locations on the spring arms 320, and include support portions 313 that extend in a generally transverse direction across the gap between the spring arms 320 and the flying trace portions 336. In particular, in the embodiment shown in FIG. 4 the tethers 312 extend onto the flying trace portions 336 from the spring arms 320 at locations near the proximal ends of the spring arms. The tethers 312 extend along a portion of the length of the flying trace portions 336 that is between the ends of the flying trace portions that intersect with the spring metal layer 322 of the gimbal region 316. In the illustrated embodiment, the tethers 312 extend for a distance of about 38% of the length and down the centerline of the flying trace portions 336, and are about 60 μm wide. Other than these differences, flexure 310 and tethers 312 can be similar to or substantially the same as those described above in connection with FIGS. 1A-1C, and similar features are identified by similar reference numbers.

Figure 5:
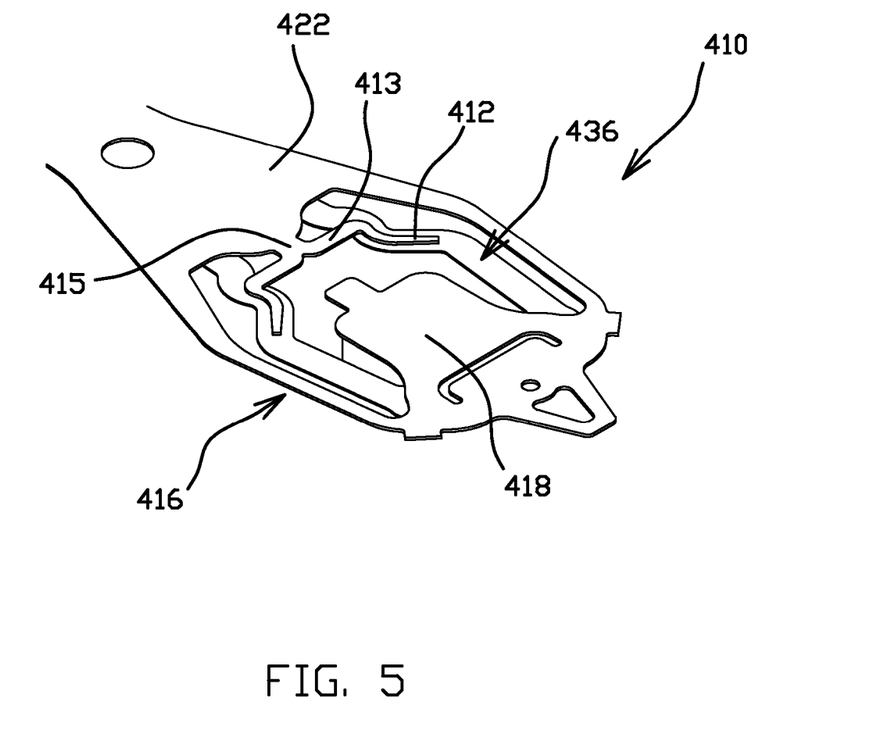
FIG. 5 is a bottom isometric view of a portion of a flexure having elongated trace tethers in accordance with a fifth embodiment of the invention.

FIG. 5 is a bottom (i.e., stainless steel side) isometric view of a portion of a flexure 410 having elongated trace tethers 412 in accordance with a fifth embodiment of the invention. Tethers 412 extend onto the flying trace portions 436 from locations between the flying trace portions, and include support portions 413 that extend in a generally transverse direction from a central support portion 415. Central support portion 415 extends toward the slider mounting region 418 from the proximal end of the gimbal region 416. The tethers 412 extend along a portion of the length of the flying lead portions 436 that is between the ends of the flying trace portions that intersect with the spring metal layer 422 of the gimbal region 416. In the illustrated embodiment, the tethers 412 extend for a distance of about 38% of the length and down the centerline of the flying trace portions 436, and are about 60 µm wide. Other than these differences, flexure 410 and tethers 412 can be similar to or substantially the same as those described above in connection with FIGS. 1A-1C, and similar features are identified by similar reference numbers.

Figure 6A:
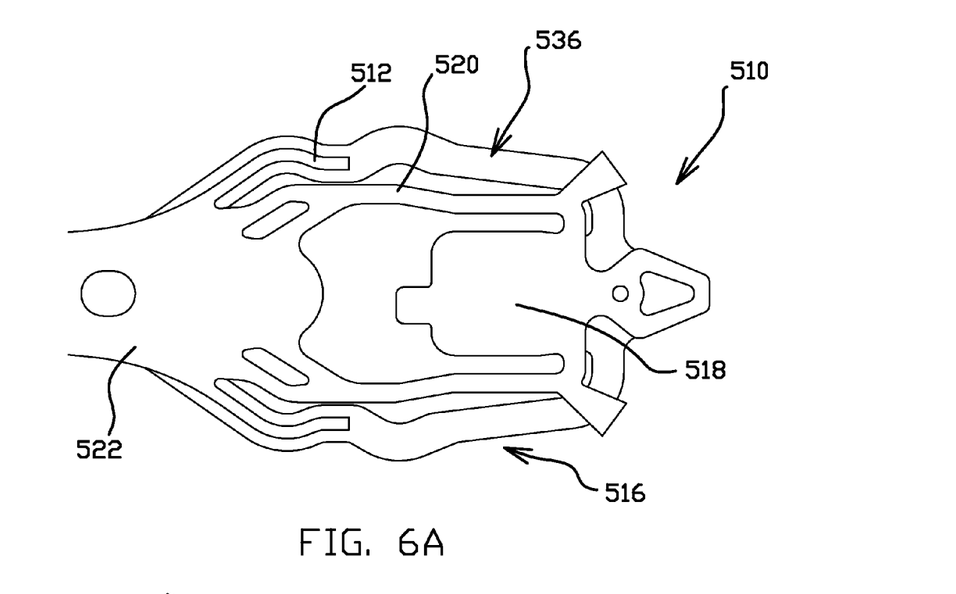
FIGS. 6A and 6B are bottom plan and isometric views, respectively, of a portion of a flexure having elongated trace tethers in accordance with a sixth embodiment of the invention.
Figure 6B:
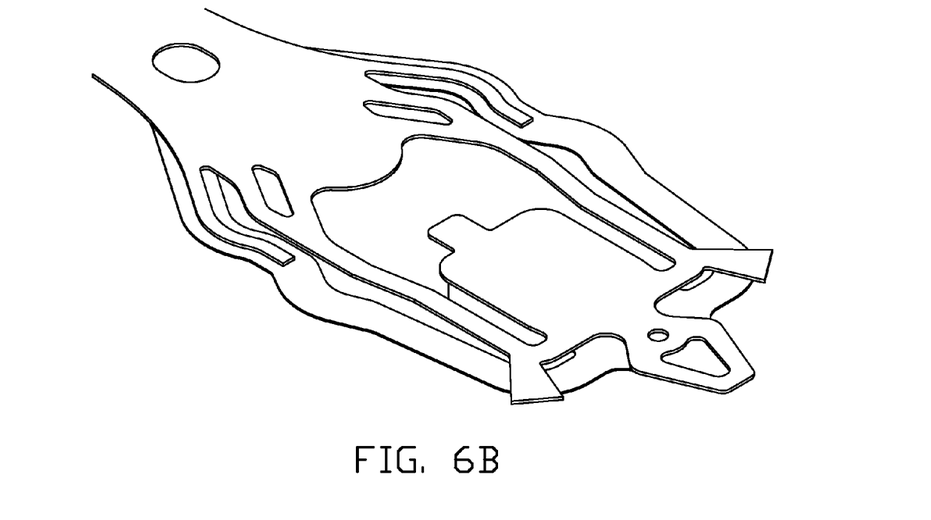

FIGS. 6A and 6B are bottom (i.e., stainless steel side) plan and isometric views of a portion of a flexure 510 having elongated trace tethers 512 in accordance with a sixth embodiment of the invention. Flexure 510 has flying trace portions 536 that are located transversely outside of the spring arms 520 (i.e., opposite the spring arms from the slider mounting region 518. Tethers 512 extend onto the flying trace portions 536 from locations on the outside edges of the proximal end of the gimbal region 516. The tethers 512 extend along a portion of the length of the flying trace portions 536 that includes the proximal end of the flying trace portions where the flying traces extend off of the spring metal layer 522 of the gimbal region 516. In the illustrated embodiment, the tethers 512 extend for a distance of about 38% of the length and down the centerline of the flying trace portions 536, and are about 60 µm wide. Other than these differences, flexure 510 and tethers 512 can be similar to or substantially the same as those described above in connection with FIGS. 1A-1C, and similar features are identified by similar reference numbers.

Figure 7A:
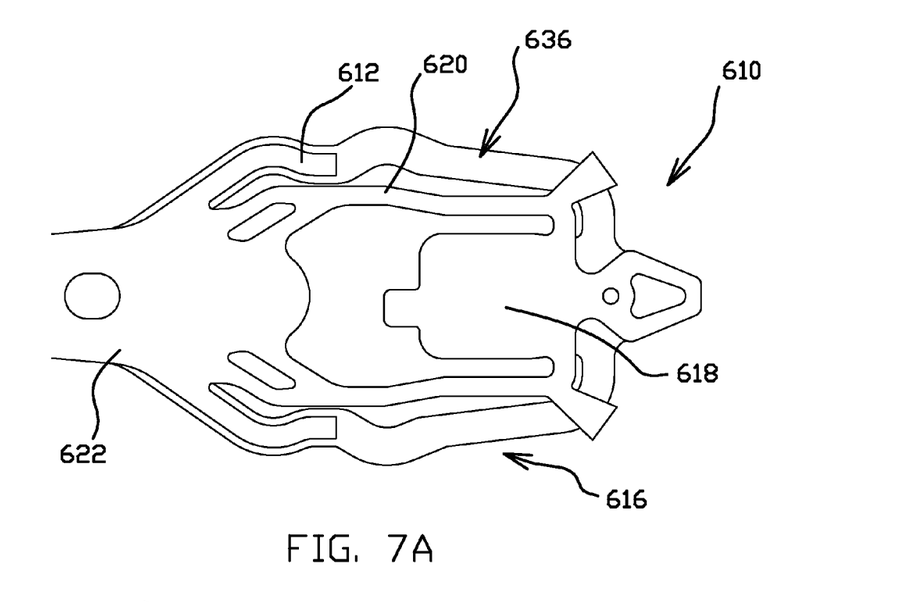
FIGS. 7A and 7B are bottom plan and isometric views, respectively, of a portion of a flexure having elongated trace tethers in accordance with a seventh embodiment of the invention.
Figure 7B:
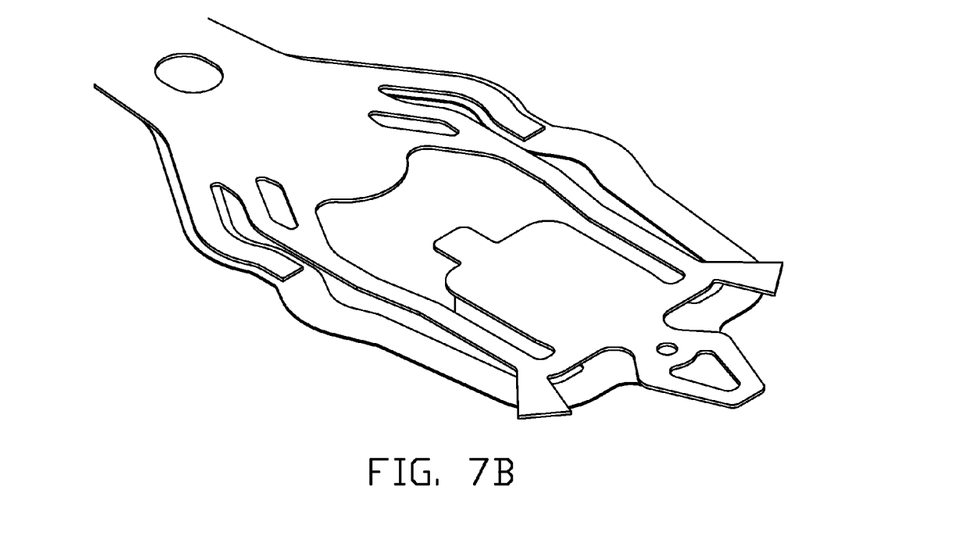

FIGS. 7A and 7B are bottom (i.e., stainless steel side) plan and isometric views of a portion of a flexure 610 having elongated trace tethers 612 in accordance with a seventh embodiment of the invention. The tethers 612 extend for a distance of about 38% of the length and down the centerline of the flying trace portions 636, and are about 100 µm wide. Other than these differences, flexure 610 and tethers 612 can be similar to or substantially the same as those of flexure 510 and tethers 512 described above in connection with FIGS. 6A and 6B, and similar features are identified by similar reference numbers.

Figure 8A:
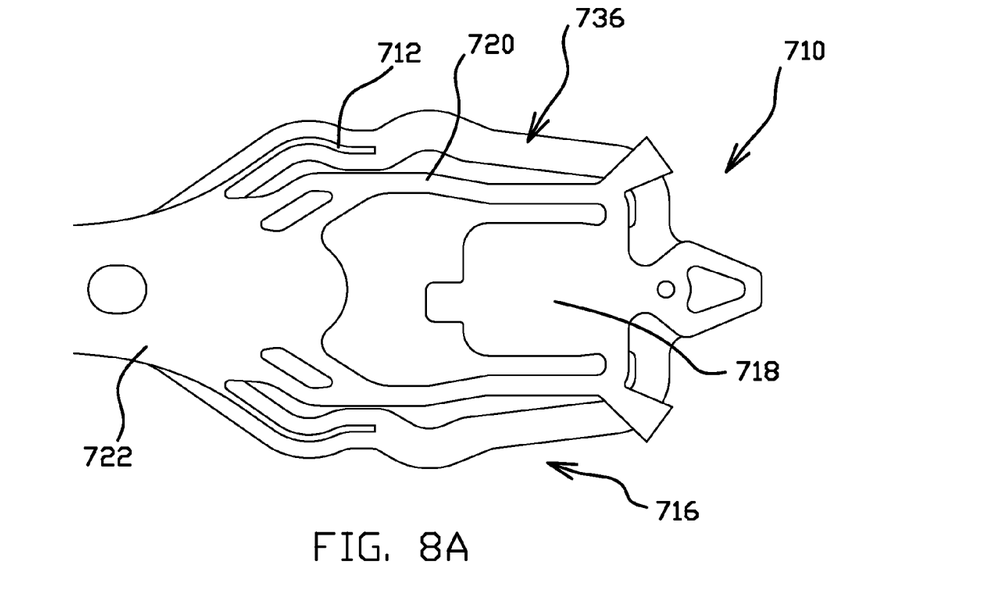
FIGS. 8A and 8B are bottom plan and isometric views, respectively, of a portion of a flexure having elongated trace tethers in accordance with an eighth embodiment of the invention.
Figure 8B:
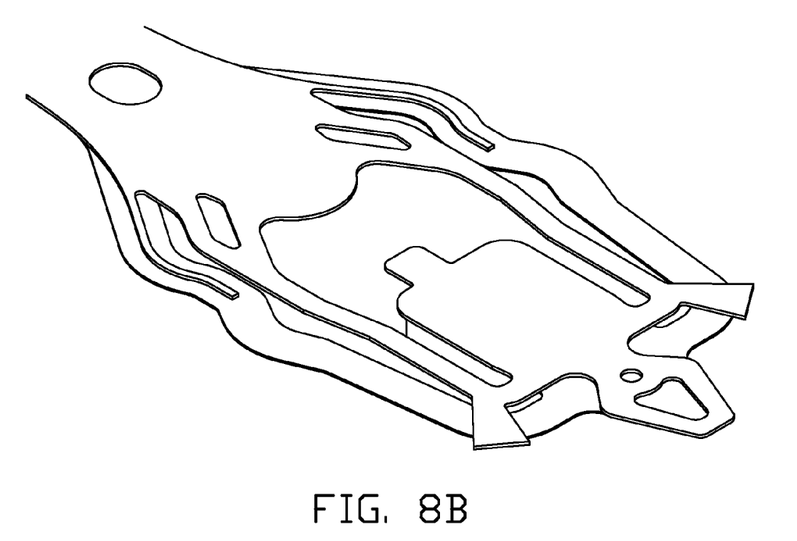

FIGS. 8A and 8B are bottom (i.e., stainless steel side) plan and isometric views of a portion of a flexure 710 having elongated trace tethers 712 in accordance with an eighth embodiment of the invention. The tethers 712 extend for a distance of about 38% of the length and down the centerline of the flying trace portions 736, and are about 40 µm wide. Other than these differences, flexure 710 and tethers 712 can be similar to or substantially the same as those of flexure 610 and tethers 612 described above in connection with FIGS. 7A and 7B, and similar features are identified by similar reference numbers.

Figure 9:
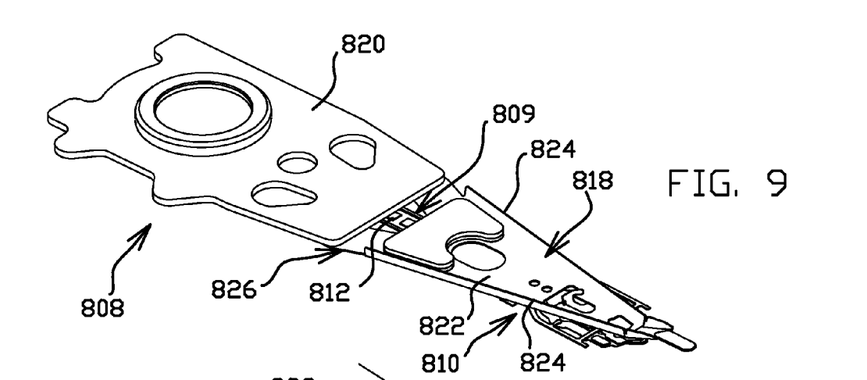
FIG. 9 is an isometric view of a suspension having a flexure with a spring region traversing portion and spring region tethers in accordance with another embodiment of the invention.
Figure 10:
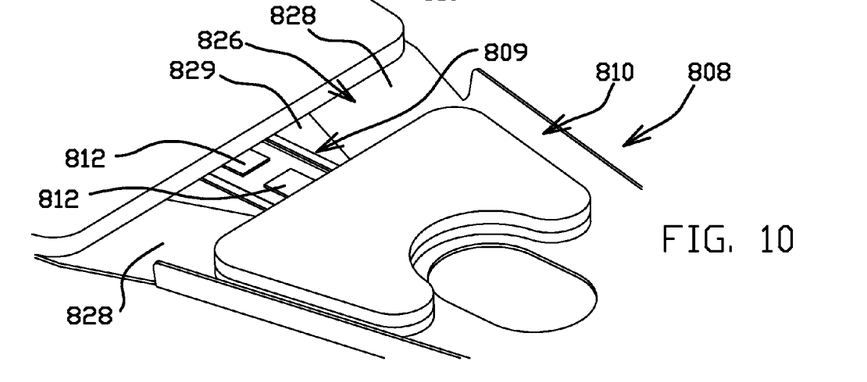
FIG. 10 is a detailed isometric view of the spring region traversing portion of the suspension shown in FIG. 9.
Figure 11:
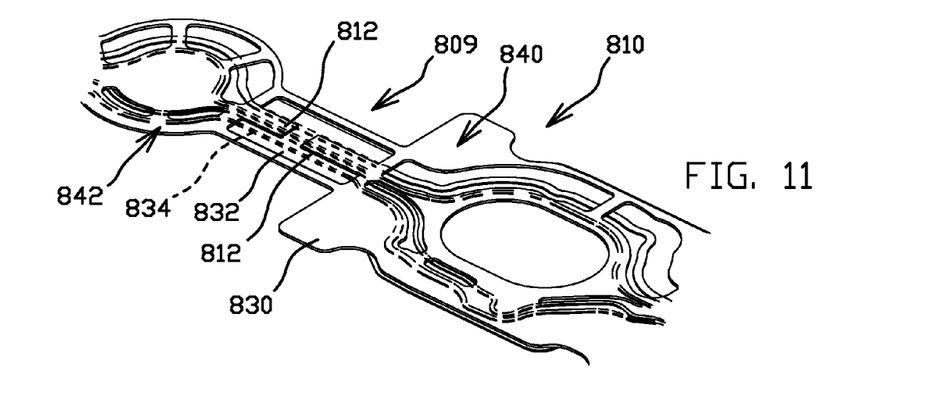
FIG. 11 is a detailed isometric view of the spring region traversing portion of the flexure shown in FIGS. 9 and 10.

FIG. 9 is an isometric view of a suspension 808 having a flexure 810 with a spring region-traversing portion 809 and spring region tethers 812 in accordance with another embodiment of the invention. FIG. 10 is a detailed isometric view of the portion of the suspension 808 including the flexure spring region-traversing portion 809. FIG. 11 is a detailed isometric illustration of the stainless steel side of the flexure 810, showing the spring region-traversing portion 809. In addition to the flexure 810, the suspension 808 includes a load beam 818 and a mounting or base plate 820. Load beam 818 includes a rigid region 822 having side rails 824 and a radius or spring region 826 having a pair of transversely spaced spring arms 828 separated by a cutout section 829. The spring region 826 joins the rigid region 822 of the load beam 818 to the base plate 820. Although the spring region 826 is shown as an integral portion of the load beam 818 in the illustrated embodiment, in other embodiments of the invention (not shown) the spring region is a separate hinge member that is attached at its proximal end to the base plate and at its distal end to the load beam.

Flexure 810 has a spring metal layer 830, leads or traces 834 formed in a conductive material layer, and a layer of insulating dielectric material 832 the separates and electrically isolates the traces from portions of the spring metal layer 830 that the traces overlay. In addition to the spring region-traversing portion 809, the flexure includes load beam portion 840 that is mounted to and extends over the rigid region 822 of the load beam 818 and a mounting region portion 842 that extends over the base plate 820. As shown in FIGS. 9 and 10, the spring region-traversing portion 809 extends across the spring region 826 over the cutout section 830, between the spring arms 828. At the spring region-traversing portion 809 the flexure 810 includes a plurality of traces 834 supported by the dielectric material layer 832. Much of the spring region-traversing portion 809 is free from material of the spring metal layer 830, and the traces 834 are generally unsupported in the spring region-traversing portion. Tethers 812 are formed in the spring metal layer 830 over the dielectric material 832 and extend across a portion of the length of the spring region-traversing portion 809 (and therefore a portion of the length of the spring region 826). In the illustrated embodiment one tether 812 extends proximally from the spring metal layer 830 of the load beam portion 840 of flexure 810, and another tether 812 extends distally from the spring metal layer of the mounting region portion 842 of the load beam.

Spring region tethers 812 are configured to have negligible impact on the nominal spring rate of the spring region 826, but will improve the stability of the relatively weak dielectric material layer 832 and conductive material traces 834 in the spring region-traversing portion 809 of the flexure 810. Metal separation of the flexure 810 from the load beam 810 and the base plate 820 can be reduced. Although the embodiment shown in FIGS. 9-11 has one tether 812 extending from both the proximal and distal ends of the spring region-traversing portion 809, other embodiments have greater or lesser numbers of spring region tethers. The lengths and/or widths of the spring region tethers 812 can also vary to tailor the performance of the tethers. For example, the lengths and/or widths of the spring region tethers 812 can be selected to change and establish the natural frequency of the spring region 826 of flexure 810. In one embodiment the minimum gap between the tethers 812 is about 10% of the length of the spring region 826. Typical widths of the spring region tethers 812 are 50-250 µm, although tethers having wider or narrower widths can be used. For example, spring region tethers 812 in the range of 500 µm wide may be used depending on the width of the unsupported traces 834 of the flexure spring region-traversing portion 809.

Figure 12:
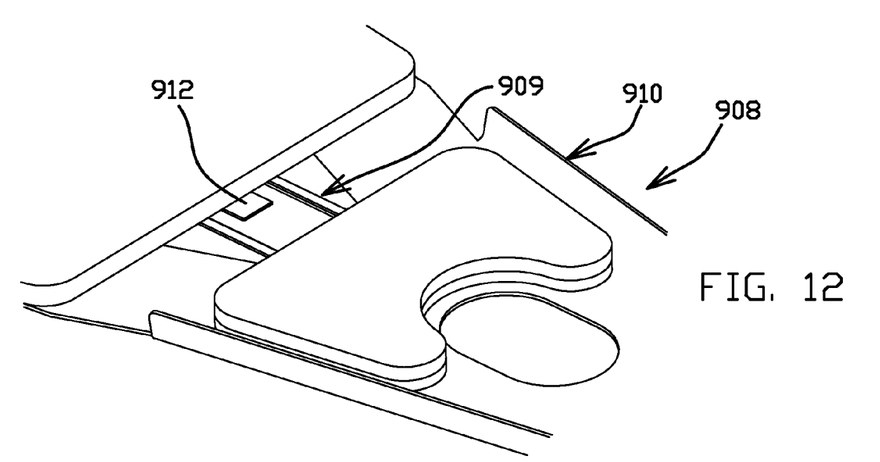
FIG. 12 is a detailed isometric view of a spring region traversing portion of a suspension and flexure in accordance with another embodiment of the invention.
Figure 13:
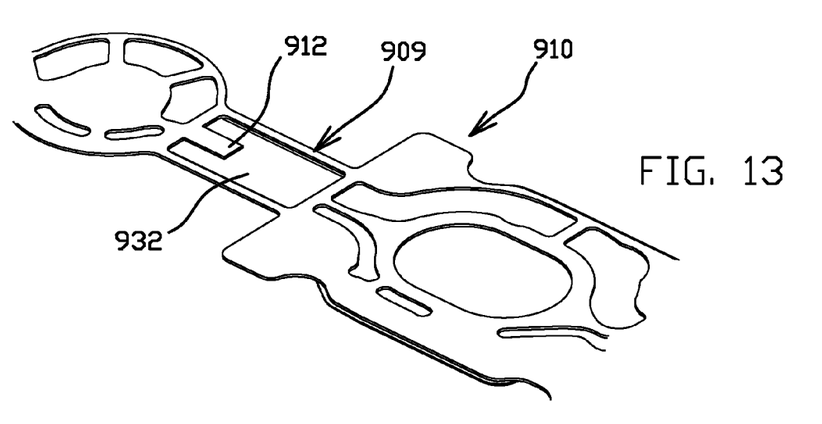
FIG. 13 is a detailed isometric view of the spring region traversing portion of the flexure shown in FIG. 12.

FIG. 12 is a detailed isometric view of the portion of a suspension 908 including a spring region-traversing portion 909 of a flexure 910 in accordance with another embodiment of the invention. FIG. 13 is a detailed isometric illustration of the stainless steel side of the flexure 910, showing the spring region-traversing portion 909. As shown, flexure 910 has a single spring region tether 912 that extends part of the distance across the length of the spring region-traversing portion 909 from the proximal end of the spring region-traversing portion. Other than these differences, flexure 910 and tether 912 can be similar to or substantially the same as those of flexure 810 and tethers 812 described above in connection with FIGS. 9-11, and similar features are identified by similar reference numbers.

Figure 14:
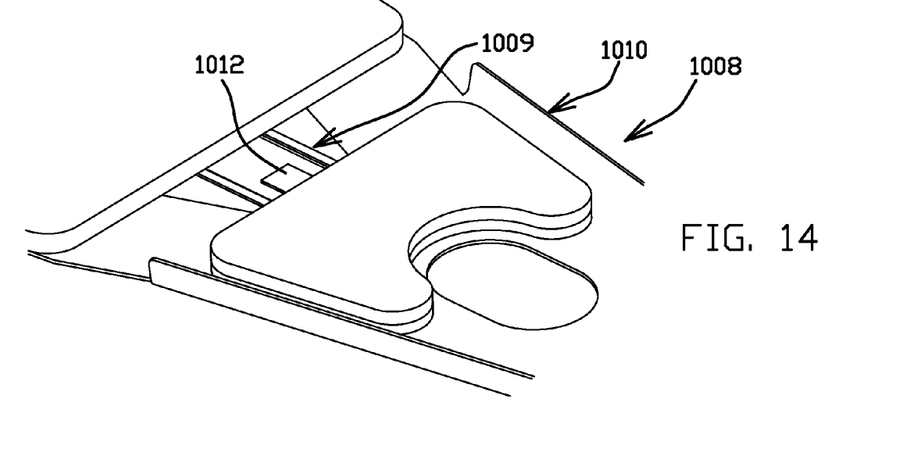
FIG. 14 is a detailed isometric view of a spring region traversing portion of a suspension and flexure in accordance with yet another embodiment of the invention.
Figure 15:
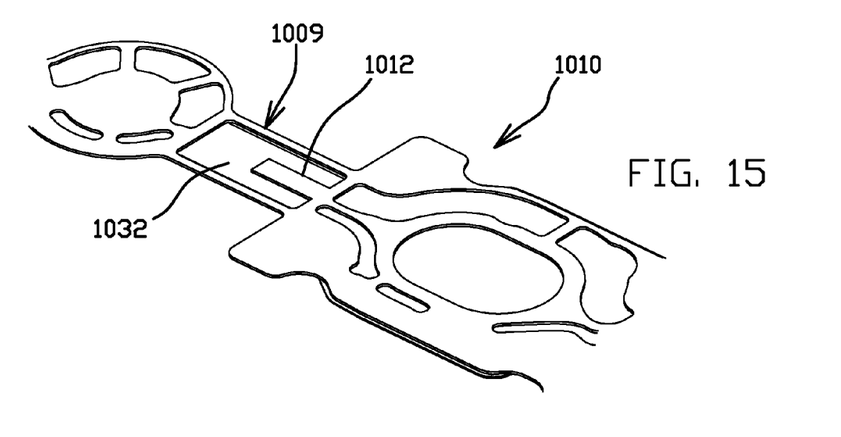
FIG. 15 is a detailed isometric view of the spring region traversing portion of the flexure shown in FIG. 14.

FIG. 14 is a detailed isometric view of the portion of a suspension 1008 including a spring region-traversing portion 1009 of a flexure 1010 in accordance with another embodiment of the invention. FIG. 15 is a detailed isometric illustration of the stainless steel side of the flexure 1010, showing the spring region-traversing portion 1009. As shown, flexure 1010 has a single spring region tether 1012 that extends part of the distance across the length of the spring region-traversing portion 1009 from the distal end of the spring region-traversing portion. Other than these differences, flexure 1010 and tether 1012 can be similar to or substantially the same as those of flexure 810 and tethers 812 described above in connection with FIGS. 9-11, and similar features are identified by similar reference numbers.

Figure 16:
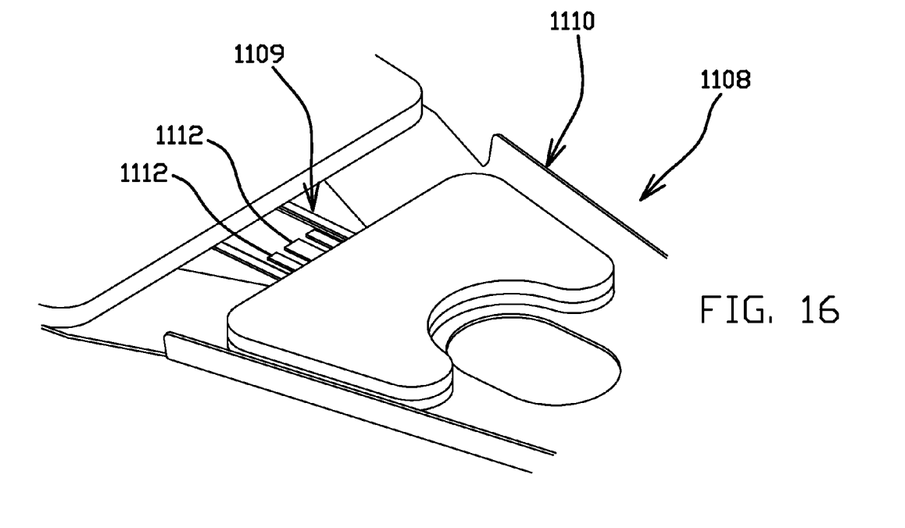
FIG. 16 is a detailed isometric view of a spring region traversing portion of a suspension and flexure in accordance with another embodiment of the invention.
Figure 17:
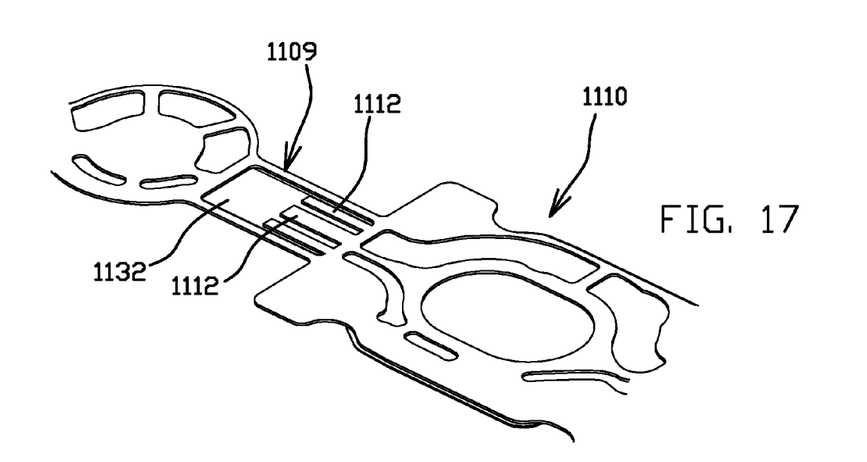
FIG. 17 is a detailed isometric view of the spring region traversing portion of the flexure shown in FIG. 16.

FIG. 16 is a detailed isometric view of the portion of a suspension 1108 including a spring region-traversing portion 1109 of a flexure 1110 in accordance with another embodiment of the invention. FIG. 17 is a detailed isometric illustration of the stainless steel side of the flexure 1110, showing the spring region-traversing portion 1109. As shown, flexure 1110 has a plurality (three are shown in the illustrated embodiment) of spring region tethers 1112 that extend part of the distance across the length of the spring region-traversing portion 1109 from the distal end of the spring region-traversing portion. Each of the spring region tethers 1112 is the same length. The tethers on the transverse sides of the center tether 1112 have widths that are less than the width of the center tether. Other than these differences, flexure 1110 and tethers 1112 can be similar to or substantially the same as those of flexure 810 and tethers 812 described above in connection with FIGS. 9-11, and similar features are identified by similar reference numbers.

Figure 18:
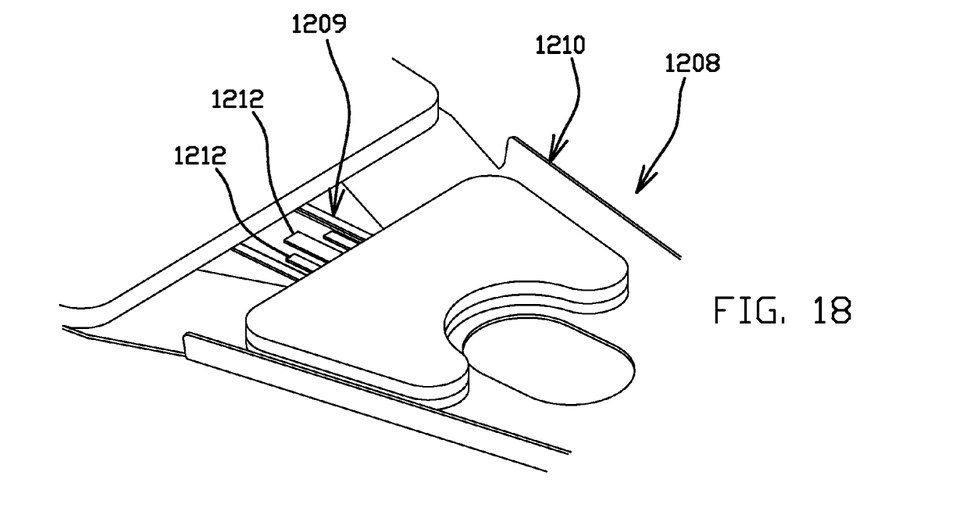
FIG. 18 is a detailed isometric view of a spring region traversing portion of a suspension and flexure in accordance with yet another embodiment of the invention.
Figure 19:
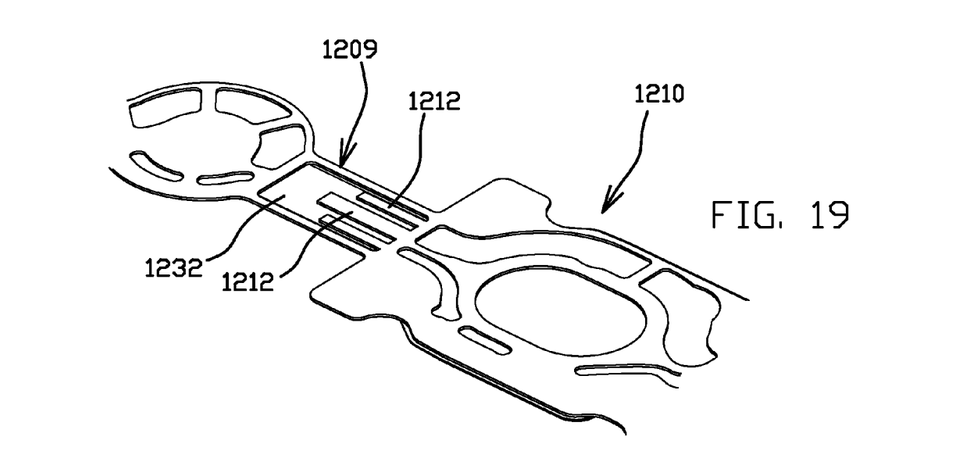
FIG. 19 is a detailed isometric view of the spring region traversing portion of the flexure shown in FIG. 18.

FIG. 18 is a detailed isometric view of the portion of a suspension 1208 including a spring region-traversing portion 1209 of a flexure 1210 in accordance with another embodiment of the invention. FIG. 19 is a detailed isometric illustration of the stainless steel side of the flexure 1210, showing the spring region-traversing portion 1209. As shown, flexure 1210 has a plurality (three are shown in the illustrated embodiment) of spring region tethers 1212 that extend part of the distance across the length of the spring region-traversing portion 1209 from the distal end of the spring region-traversing portion. The tethers 1212 on the transverse sides of the center tether 1212 have the same length and are shorter than the center tether. The tethers on the transverse sides of the center tether 1212 have widths that are less than the width of the center tether. Other than these differences, flexure 1210 and tethers 1212 can be similar to or substantially the same as those of flexure 810 and tethers 812 described above in connection with FIGS. 9-11, and similar features are identified by similar reference numbers.

Although the invention has been described with reference to preferred embodiments, those skilled in the art will recognize that changes can be made in form and detail without departing from the spirit and scope of the invention. For example, flexures in accordance with the invention can have both flying trace tethers and spring region tethers.

The invention claimed is:

1. An integrated lead flexure of the type including a spring metal layer, a conductive material layer and an insulating layer between the spring metal and conductive material layers, the flexure comprising:
    first and second spaced-apart regions in the spring metal layer;
    an unsupported trace portion in the conductive material layer extending between the first and second spaced-apart regions, wherein the unsupported trace portion includes a width and a length and is not backed by the spring metal layer;
    an elongated trace tether in the spring metal layer connected to one of the first and second spaced-apart regions and having a length extending continuously along a distance of the unsupported trace portion that is less than the length of the unsupported trace portion, wherein the elongated trace tether has a width that is relatively narrow with respect to the corresponding width of the unsupported trace portion along the entire length of the elongated trace tether, wherein the unsupported trace portion is not supported by the spring metal layer except for one or more elongated trace tethers including the elongated trace tether; and
    an insulating material portion in the insulating layer between the unsupported trace portion and the elongated trace tether.

2. The integrated lead flexure of claim 1 wherein the unsupported trace portion includes a plurality of traces.

3. The integrated lead flexure of claim 2 wherein the width of the elongated trace tether is less than a width of the insulating material portion.

4. The integrated lead flexure of claim 3 and further including a plurality of elongated trace tethers extending along the unsupported trace portion.

5. The integrated lead flexure of claim 2 wherein the tether extends along the distance about 20% or less of the length of the unsupported trace portion.

6. The integrated lead flexure of claim 5 wherein the elongated trace tether width is about 60 μm or less.

7. The integrated lead flexure of claim 2 wherein the tether extends along the distance about 20%-50% of the length of the unsupported trace portion.

8. The integrated lead flexure of claim 7 wherein the elongated trace tether width is about 60 μm or less.

9. The integrated lead flexure of claim 2 wherein the unsupported trace portion and elongated trace tether are in a gimbal region of the flexure.

10. The integrated lead flexure of claim 1, wherein the entire portion of the unsupported trace portion between a first end of the elongated trace tether and the other of the first and second spaced-apart regions is not backed by the spring metal layer.

11. The integrated lead flexure of claim 10, wherein the elongated trace tether is connected to the one of the first and second spaced-apart regions at a second end.

12. The integrated lead flexure of claim 1, wherein the entire length of the elongated trace tether extends continuously along the unsupported trace portion.

13. The integrated lead flexure of claim 1, wherein along the distance, the elongated trace tether is less than half the width of the elongated trace portion.

14. The integrated lead flexure of claim 1, wherein the elongated trace tether is the only elongated trace tether extending from the one of the first and second regions, and the flexure optionally includes another elongated trace tether being the only elongated trace tether extending from the other of the first and second regions, wherein the one or more elongated trace tethers supporting the unsupported trace portion includes the another elongated trace tether.

15. An integrated lead flexure of the type including a spring metal layer, a conductive material layer and an insulating layer between the spring metal and conductive material layers, the flexure comprising:
    a base region in the spring metal layer;

a gimbal region in the spring metal layer, the gimbal region including a slider mounting region supported from the base region by a first and second spring arms;

a plurality of traces in the conductive material layer extending along the base and gimbal regions, the traces including a plurality of flying trace portions at the gimbal region that each have a width and a length and are not backed by the spring metal layer;

elongated trace tethers in the spring metal layer connected to and having a length extending from the base or gimbal region continuously along a distance of the flying trace portions that is less than the length of the flying trace portions, wherein each of the elongated trace tethers has a width that is relatively narrow with respect to the corresponding width of the plurality of flying trace portions along the entire length of the elongated trace tether, wherein the plurality of flying trace portions are not supported by the spring metal layer except for the elongated trace tethers; and flying trace insulating material portions in the insulating layer between the flying trace portions and the elongated trace tethers.

16. The integrated lead flexure of claim 15 wherein:

each flying trace portion includes a plurality of traces;

the flying trace insulating material portions have a width; and the width of the elongated trace tethers is less than the width of the flying trace insulating material portions.

17. The integrated lead flexure of claim 16 wherein the trace tethers extend from the base region along the flying trace portions.

18. The integrated lead flexure of claim 15 wherein the tether extends along the distance about 20% or less of the length of the flying trace portions.

19. The integrated lead flexure of claim 18 wherein the elongated trace tether width is about 60 μm or less.

20. The integrated lead flexure of claim 15 wherein the tether extends along the distance about 20%-50% of the length of the flying trace portions.

21. The integrated lead flexure of claim 20 wherein the elongated trace tether width is about 60 μm or less.

22. An integrated lead flexure for a disk drive head suspension formed from layers of material including a spring metal layer, a conductive material layer and an insulating material layer between the spring metal and conductive material layers, the flexure including a gimbal region, the gimbal region including flying traces with each having a width and a length, and one or more elongated tethers with each having a width and a length, each elongated tether extending from the spring metal layer and continuously along a distance of one of the flying traces that is less than the length of the one flying trace, wherein the width of each elongated tether is relatively narrow with respect to the width of the corresponding flying trace along the entire length of the elongated tether, and wherein the flying traces are not supported by the spring metal layer except for the one or more elongated tethers.

* * * * *